US012733508B2

(12) United States Patent
Park et al.

(10) Patent No.: US 12,733,508 B2
(45) Date of Patent: Sep. 8, 2026

(54) SEMICONDUCTOR DEVICE INCLUDING ALIGNMENT KEY

(71) Applicant: SAMSUNG ELECTRONICS CO., LTD., Suwon-si (KR)

(72) Inventors: Jong-Su Park, Suwon-si (KR); Jaehan Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 376 days.

(21) Appl. No.: 18/229,290

(22) Filed: Aug. 2, 2023

(65) Prior Publication Data

US 2024/0162160 A1 May 16, 2024

(30) Foreign Application Priority Data

Nov. 11, 2022 (KR) ........................ 10-2022-0150767

(51) Int. Cl.

*H10W 46/00* (2026.01)
*H10B 41/27* (2023.01)
*H10B 41/41* (2023.01)
*H10B 43/27* (2023.01)
*H10B 43/40* (2023.01)

(52) U.S. Cl.

CPC ............ *H10W 46/00* (2026.01); *H10B 41/27* (2023.02); *H10B 41/41* (2023.02); *H10B 43/27* (2023.02); *H10B 43/40* (2023.02); *H10W 46/301* (2026.01)

(58) Field of Classification Search

CPC ........ H01L 23/544; H01L 2223/54426; H10B 41/27; H10B 41/41; H10B 43/27; H10B 43/40

See application file for complete search history.

(56) References Cited

U.S. PATENT DOCUMENTS 4,720,635 A 1/1988 Uga
6,441,497 B1 * 8/2002 Han ...................... H01L 23/544 257/E21.705
7,595,251 B2 9/2009 Cho et al.
7,999,399 B2 8/2011 Cho et al.
9,318,444 B2 4/2016 Chen
10,622,312 B2 4/2020 Kim et al.
10,629,546 B2 4/2020 Roh
2008/0157384 A1 7/2008 Jeon
2022/0189823 A1 * 6/2022 Kim ...................... H01L 23/544
2023/0005860 A1 * 1/2023 Chen .................. H01L 25/0657

FOREIGN PATENT DOCUMENTS

KR 20220082564 A 6/2022
KR 20220111567 A 8/2022

* cited by examiner

*Primary Examiner* — Jay C Kim
*Assistant Examiner* — Woo K Lee
(74) *Attorney, Agent, or Firm* — Muir Patent Law, PLLC

(57) ABSTRACT

A semiconductor device includes a first peripheral circuit structure and a cell stack structure disposed on the first peripheral circuit structure and including electrode layers and inter-electrode insulating layers that are alternately and repeatedly stacked, the first peripheral circuit structure includes a first substrate, first peripheral transistors disposed on the first substrate, a first peripheral insulating layer covering the first substrate and the first peripheral transistors, and a first peripheral alignment key on the first peripheral insulating layer, and the first peripheral alignment key overlaps the cell stack structure.

20 Claims, 13 Drawing Sheets

FIG. 2

CS
SCL
12
EL
EL
12
EL
12
SC1
SC2
20d
20c
20b
20a
101
B'
DR
SR
14b
12b
14a
12a
12c
14c
PA(1)
PA(2)
DR
PA(3)
201
PTR
STI
22
SR
DR
B
PS
VS
PL

Figure 9:
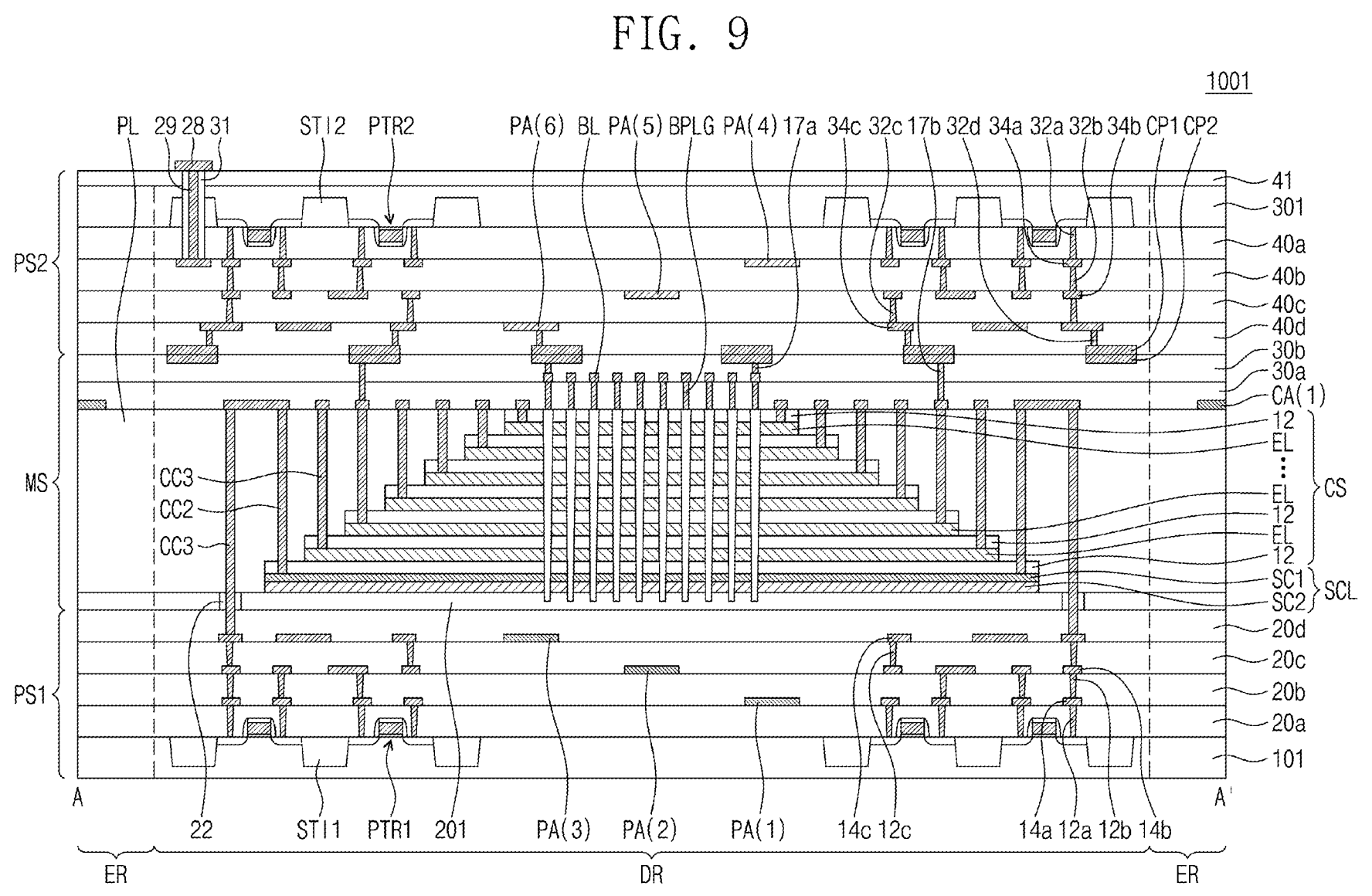

CS SCL

A' A

CP2 CP1 34b 32b 32a 34a 32d 17b 32c 34c 17a PA(4) BPLG PA(5) BL PA(6) PTR2 STI2 31 28 29 PL 14b 12b 12a 14a 14c 12c PA(1) PA(2) PA(3) 201 PTR1 STI1 22

CC3 CC2 CC3

ER DR ER

PS2 MS PS1

SEMICONDUCTOR DEVICE INCLUDING ALIGNMENT KEY

CROSS-REFERENCE TO RELATED APPLICATION

This U.S. non-provisional patent application claims priority under 35 U.S.C. § 119 to Korean Patent Application No. 10-2022-0150767, filed on Nov. 11, 2022, in the Korean Intellectual Property Office, the entire contents of which are hereby incorporated by reference.

BACKGROUND

1. Field

Embodiments relate to a semiconductor device, and more particularly, to a semiconductor device including an alignment key.

2. Description of the Related Art

In general, a wafer on which semiconductor devices are formed may be divided into device regions (where a plurality of cells are formed) and a scribe lane region therebetween. A plurality of semiconductor devices, e.g., transistors, resistors, capacitors, and so on, may be formed on the device region, while no semiconductor devices may be formed on the scribe lane region, so each semiconductor chip may be completed by sawing along the scribe lane region. In the scribe lane region, an alignment key may be formed for an exposure process or a test pattern to monitor whether the process proceeded normally, e.g., by monitoring electrical characteristics of the semiconductor devices in the device region and checking whether there are defect patterns.

SUMMARY

A semiconductor device according to some embodiments includes a first peripheral circuit structure and a cell stack structure disposed on the first peripheral circuit structure and including electrode layers and inter-electrode insulating layers that are alternately and repeatedly stacked, the first peripheral circuit structure includes a first substrate, first peripheral transistors disposed on the first substrate, a first peripheral insulating layer covering the first substrate and the first peripheral transistors, and a first peripheral alignment key on the first peripheral insulating layer, and the first peripheral alignment key overlaps the cell stack structure.

A semiconductor device according to some embodiments includes a first peripheral circuit structure, a cell stack structure disposed on the first peripheral circuit structure and including electrode layers and inter-electrode insulating layers that are alternately and repeatedly stacked, a planarization insulating layer covering an end of the cell stack structure and the first peripheral circuit structure, and a cell alignment key disposed on an edge of the planarization insulating layer, the first peripheral circuit structure includes a first substrate, first peripheral transistors disposed on the first substrate, a first peripheral insulating layer covering the first substrate and the first peripheral transistors, and a first peripheral alignment key on the first peripheral insulating layer, a side surface of the first peripheral alignment key has a first surface roughness, and a side surface of the cell alignment key has a second surface roughness greater than the first surface roughness.

A semiconductor device according to some embodiments includes a first peripheral circuit structure, a cell stack structure disposed on the first peripheral circuit structure and including electrode layers and inter-electrode insulating layers that alternately and repeatedly stacked, vertical semiconductor patterns passing through the cell stack structure, a gate insulating layer interposed between the vertical semiconductor patterns and the cell stack structure, a planarization insulating layer covering an end of the cell stack structure and the first peripheral circuit structure, and a cell alignment key disposed on an edge of the planarization insulating layer, the first peripheral circuit structure includes a first substrate, first peripheral transistors disposed on the first substrate, a first peripheral insulating layer covering the first substrate and the first peripheral transistors, and a first peripheral alignment key on the first peripheral insulating layer, the first peripheral alignment key overlaps at least one of the vertical semiconductor patterns, the first peripheral alignment key has a first width, and the cell alignment key has a second width smaller than the first width.

BRIEF DESCRIPTION OF THE DRAWINGS

Features will become apparent to those of skill in the art by describing in detail exemplary embodiments with reference to the attached drawings, in which:

FIG. 2 is a cross-sectional view of FIG. 1 along line A-A'.

FIG. 9 is a cross-sectional view of a semiconductor device according to embodiments.

DETAILED DESCRIPTION

Hereinafter, embodiments will be described in more detail with reference to the accompanying drawings.

Figure 1:
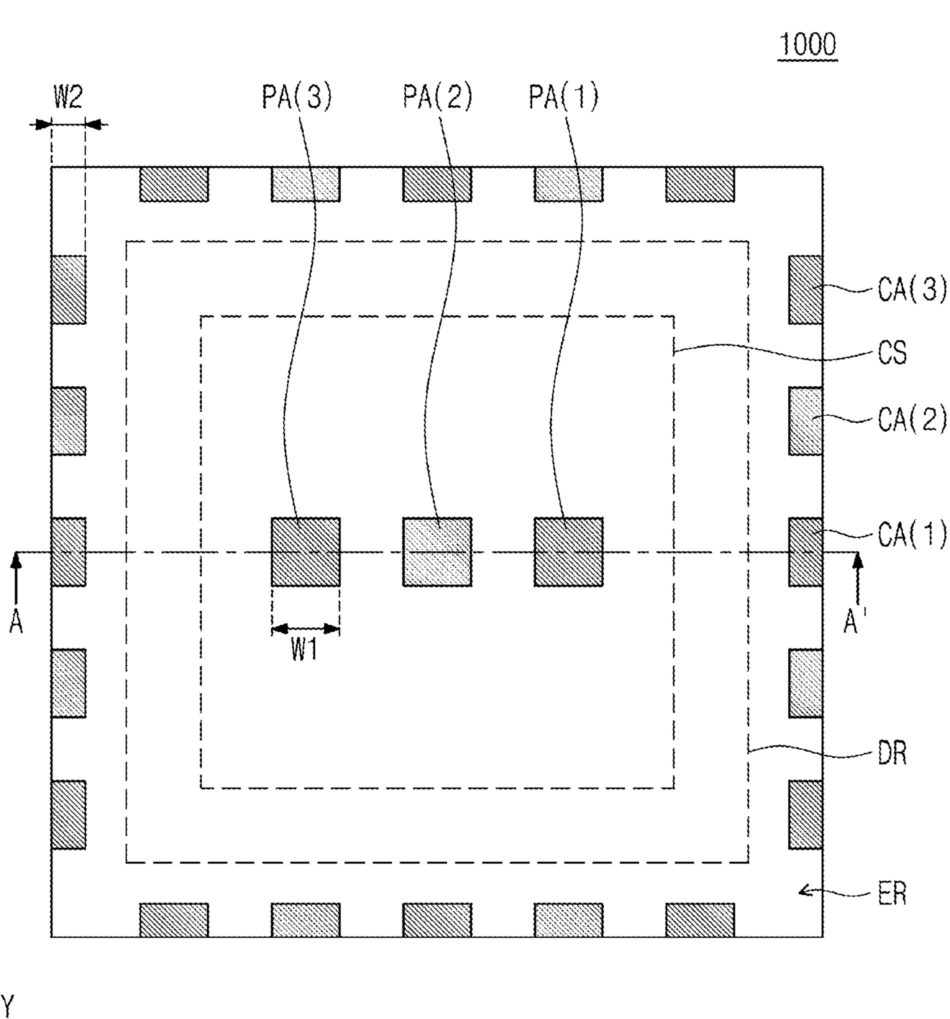
FIG. 1 is a top plan view of a semiconductor device according to embodiments.
Figure 2:
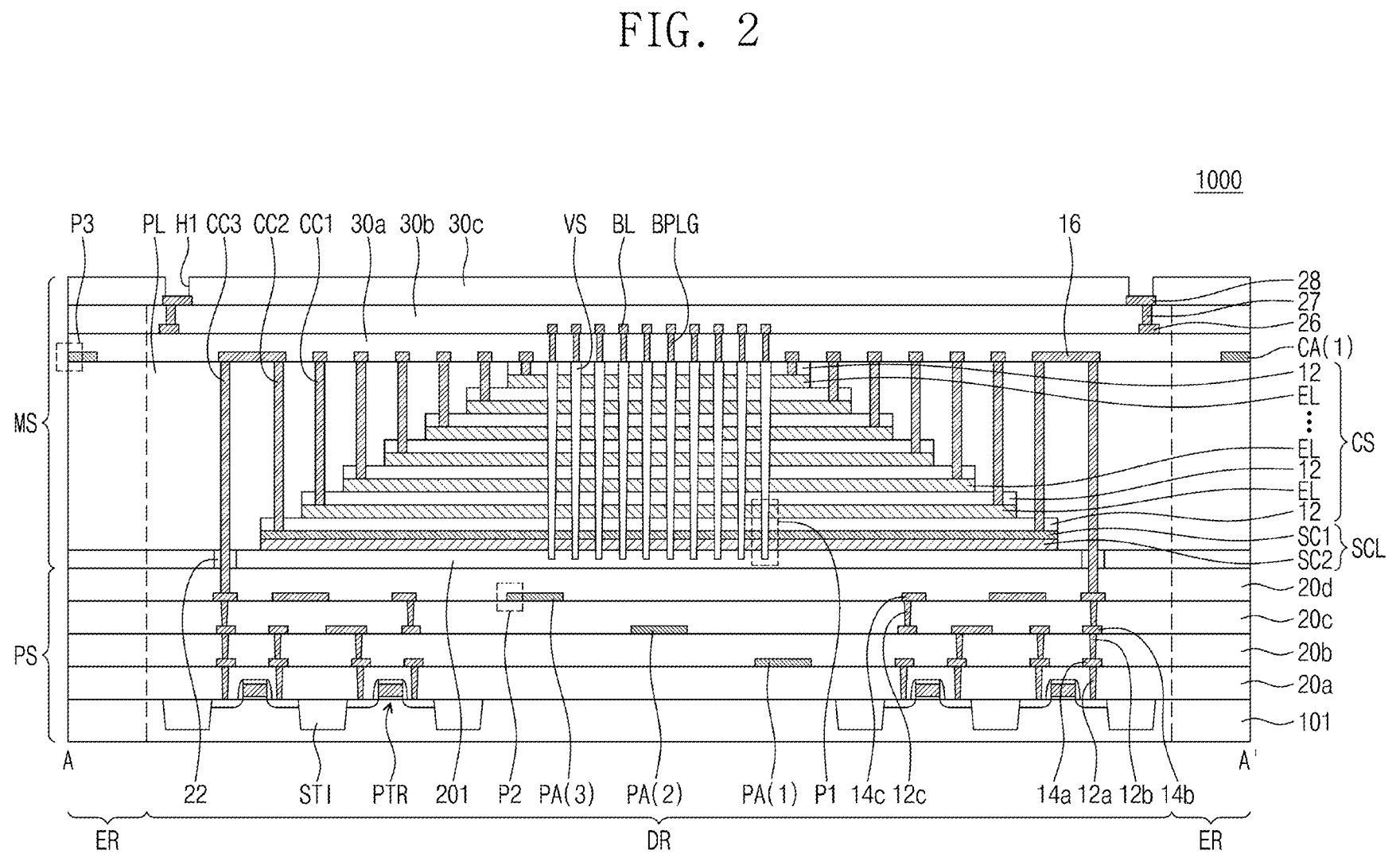

FIG. 1 is a top plan view of a semiconductor device according to embodiments. FIG. 2 is a cross-sectional view of FIG. 1 taken along line A-A' according to embodiments.

Referring to FIGS. 1 and 2, a semiconductor device 1000 according to the present embodiment may include a device region DR and an edge region ER. The edge region ER may surround the device region DR. The semiconductor device 1000 may include a peripheral circuit structure PS and a memory structure MS disposed thereon.

The peripheral circuit structure PS may include a first substrate 101. The first substrate 101 may include, e.g., a semiconductor material. The first substrate 101 may be a silicon single crystal substrate or a silicon on insulator (SOI) substrate. Device isolation layers STI may be disposed on the first substrate 101 to define active regions. First peripheral transistors PTR may be disposed on the first substrate 101. The peripheral transistors PTR may correspond to pass transistors and/or bit line select transistors for driving the subsequent memory structure MS. The peripheral transistors PTR may be covered with a first peripheral insulating layer 20*a*. First peripheral contacts 12*a* may be disposed in the first peripheral insulating layer 20*a* and may be in contact with source/drain regions of the peripheral transistors PTR.

First peripheral wires 14*a* and a first peripheral alignment key PA(1) may be disposed, e.g., directly, on the first peripheral insulating layer 20*a*. Some of the first peripheral wires 14*a* may be connected to the first peripheral contacts 12*a*. The first peripheral alignment key PA(1) is not connected to the first peripheral contacts 12*a*. The first peripheral alignment key PA(1) may include the same material as that of the first peripheral wires 14*a*. The first peripheral alignment key PA(1) may have the same thickness as that of the first peripheral wires 14*a*. The first peripheral alignment key PA(1) and the first peripheral wires 14*a* may be disposed in the device region DR. The first peripheral alignment key PA(1) and the first peripheral wires 14*a* may be disposed at the same height as each other, e.g., relative to a bottom of the first substrate 101.

A second peripheral insulating layer 20*b* may be disposed on the first peripheral insulating layer 20*a*, the first peripheral alignment key PA(1), and the first peripheral wires 14*a*. First peripheral vias 12*b* may be disposed in the second peripheral insulating layer 20*b* and may be in contact with some of the first peripheral wires 14*a*.

A second peripheral alignment key PA(2) and second peripheral wires 14*b* may be disposed on the second peripheral insulating layer 20*b*. Some of the second peripheral wires 14*b* may be connected to the first peripheral vias 12*b*. The second peripheral alignment key PA(2) is not connected to the first peripheral vias 12*b*. The second peripheral alignment key PA(2) may include the same material as that of the second peripheral wires 14*b*. The second peripheral alignment key PA(2) may have the same thickness as that of the second peripheral wires 14*b*. The second peripheral alignment key PA(2) and the second peripheral wires 14*b* may be disposed in the device region DR. The second peripheral alignment key PA(2) and the second peripheral wires 14*b* may be disposed at the same height as each other, e.g., relative to a bottom of the first substrate 101. The second peripheral alignment key PA(2) does not overlap the first peripheral alignment key PA(1) in a vertical direction, e.g., the first and second peripheral alignment keys PA(1) and PA(2) may have a non-overlapping relationship in both the vertical and horizontal directions.

A third peripheral insulating layer 20*c* may be disposed on the second peripheral insulating layer 20*b*, the second peripheral alignment key PA(2), and the second peripheral wires 14*b*. Second peripheral vias 12*c* may be disposed in the third peripheral insulating layer 20*c* and may be in contact with some of the second peripheral wires 14*b*.

A third peripheral alignment key PA(3) and third peripheral wires 14*c* may be disposed on the third peripheral insulating layer 20*c*. Some of the third peripheral wires 14*c* may be connected to the second peripheral vias 12*c*. The third peripheral alignment key PA(3) is not connected to the second peripheral vias 12*c*. The third peripheral alignment key PA(3) may include the same material as that of the third peripheral wires 14*c*. The third peripheral alignment key PA(3) may have the same thickness as that of the third peripheral wires 14*c*. The third peripheral alignment key PA(3) and the third peripheral wires 14*c* may be disposed in the device region DR. The third peripheral alignment key PA(3) and the third peripheral wires 14*c* may be disposed at the same height as each other, e.g., relative to a bottom of the first substrate 101. The third peripheral alignment key PA(3) does not overlap the second peripheral alignment key PA(2) and the first peripheral alignment key PA(1), e.g., the first through third peripheral alignment keys PA(1) through PA(3) may have a non-overlapping relationship in both the vertical and horizontal directions.

A fourth peripheral insulating layer 20*d* may be disposed on the third peripheral insulating layer 20*c*, the third peripheral alignment key PA(3), and the third peripheral wires 14*c*. Each of the first to fourth peripheral insulating layers 20*a*, 20*b*, 20*c*, and 20*d* may have a single layer or multilayer structure of at least one of, e.g., silicon oxide, silicon nitride, silicon oxynitride, silicon carbonitride, and porous insulator.

The memory structure MS may include a second substrate 201, a source structure SCL, and a cell stack structure CS, which are sequentially stacked. The second substrate 201 may include, e.g., a semiconductor material. The second substrate 201 may also be referred to as a 'semiconductor layer' or a 'silicon layer'. For example, the second substrate 201 may be doped with impurities of a first conductivity type. For example, the impurities of the first conductivity type may be of p-type, e.g., boron. In another example, the impurities of the first conductivity type be of n-type, e.g., arsenic or phosphorus.

The source structure SCL may include a first source pattern SC1 and a second source pattern SC2 thereunder. The first source pattern SC1 may include a semiconductor pattern doped with impurities, e.g., polysilicon doped with impurities of the first conductivity type. The second source pattern SC2 may include a semiconductor pattern doped with impurities, e.g., polysilicon doped with impurities. The second source pattern SC2 may further include a semiconductor material different from that of the first source pattern SC1. A conductivity type of impurities doped in the second source pattern SC2 may be the same as that of the impurities doped in the first source pattern SC1. A concentration of impurities doped in the second source pattern SC2 may be the same as or different from a concentration of impurities doped in the first source pattern SC1. The source structure SCL may function as a common source line in the memory structure MS.

The cell stack structure CS may include alternately stacked electrode layers EL and inter-electrode insulating layers 12. Ends of the electrode layers EL and the inter-electrode insulating layers 12 may form a stepped shape. Among the electrode layers EL, the electrode layer EL disposed at a bottom and the electrode EL disposed thereon may correspond to gate electrodes of a lower erase control transistor and a ground selection transistor, respectively. Two of the uppermost electrode layers EL may be separated into a plurality of lines and may correspond to gate electrodes of an upper erase control transistor and a string select transistor. Other electrode layers EL may correspond to word lines. At least one of the other electrode layers EL may be a dummy word line that does not actually operate.

The electrode layers EL may include at least one of, e.g., a doped semiconductor (e.g., doped silicon, etc.), a metal (e.g., tungsten, copper, aluminum, etc.), a conductive metal nitride (e.g., titanium nitride, tantalum nitride, etc.) or a transition metal (e.g., titanium, tantalum, etc.). The inter-electrode insulating layers 12 may include at least one single layer or multiple layers of, e.g., a silicon oxide layer, a silicon nitride layer, a silicon oxynitride layer, or a porous insulating layer.

Figure 3:
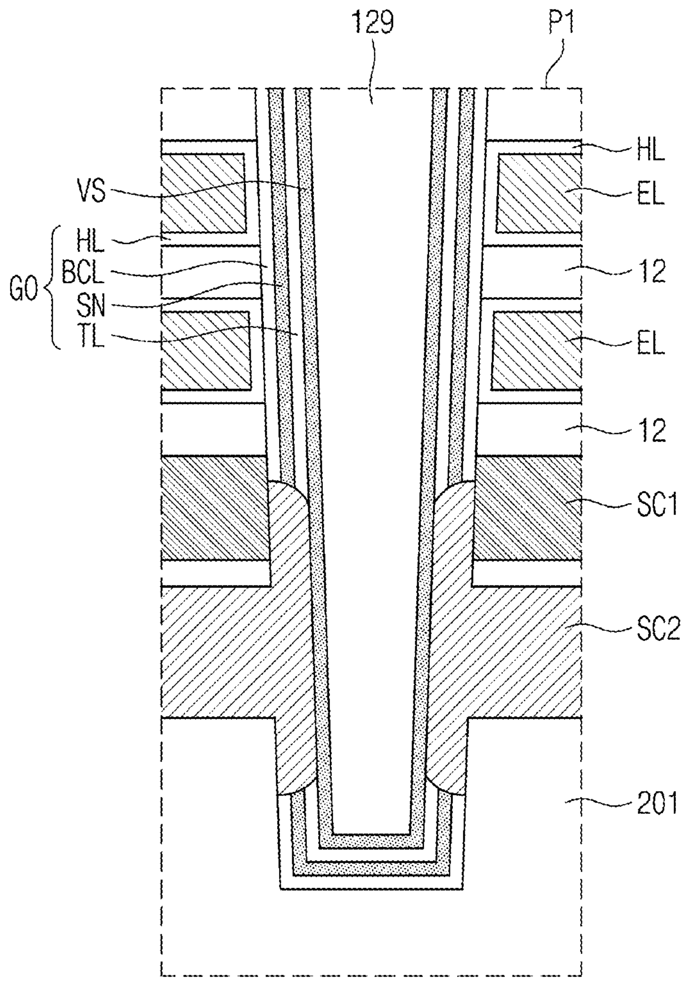
FIG. 3 is an enlarged view of portion ‘P1’ of FIG. 2.

FIG. 3 is an enlarged view of portion 'P1' of FIG. 2. Referring to FIGS. 2 and 3, vertical semiconductor patterns VS may pass through the cell stack structure CS and the source structure SCL, and may be adjacent to the second substrate 201. A gate insulating layer GO may be interposed between the vertical semiconductor patterns VS and the cell stack structure CS.

The gate insulating layer GO may include a tunnel insulating layer TL, a charge storage layer SN, and a blocking insulating layer BCL. The tunnel insulating layer TL may be one of materials having a larger band gap than that of the charge storage layer SN. For example, the tunnel insulating layer TL may include silicon oxide. For example, the blocking insulating layer BCL may be silicon oxide or a high dielectric layer having a dielectric constant higher than that of silicon oxide. For example, the high dielectric layer may include metal oxide, e.g., aluminum oxide and/or hafnium oxide. The charge storage layer SN may be a trap insulating layer, a floating gate electrode, or an insulating layer including conductive nano dots. More specifically, the charge storage layer SN may include at least one of, e.g., a silicon nitride layer, a silicon oxynitride layer, a silicon-rich nitride layer, nanocrystalline silicon, and a laminated trap layer.

The gate insulating layer GO may further include a high dielectric layer HL. The high dielectric layer HL may be interposed between the blocking insulating layer BCL and the electrode layers EL. The high dielectric layer HL may be interposed between the electrode layers EL and the inter-electrode insulating layers 12. The high-dielectric layer HL is a layer having a higher dielectric constant than that of the silicon oxide layer and may include, e.g., a metal oxide layer (e.g., a hafnium oxide layer or an aluminum oxide layer). The second source pattern SC2 may pass through the gate insulating layer GO and may be in contact with the vertical semiconductor patterns VS.

For example, the vertical semiconductor patterns VS may include silicon. Sidewalls of the vertical semiconductor patterns VS may have an inflection point adjacent to a center level of the cell stack structure CS. Each of the vertical semiconductor patterns VS may have a hollow cup shape. A filling insulating pattern 129 may fill the vertical semiconductor patterns VS. The filling insulating pattern 129 may have, e.g., a single layer structure or a multilayer structure of at least one of a silicon oxide layer, a silicon nitride layer, and a silicon oxynitride layer. Bit line pads may be disposed on each of the vertical semiconductor patterns VS. The bit line pad may include polysilicon doped with impurities or a metal, e.g., tungsten, aluminum, or copper.

The first to third peripheral alignment keys PA(1), PA(2), and PA(3) may overlap the cell stack structure CS in the vertical direction, e.g., the cell stack structure CS may overlap an entire top surface of each of the first to third peripheral alignment keys PA(1), PA(2), and PA(3). At least one of the first to third peripheral alignment keys PA(1), PA(2), and PA(3) may overlap at least one of the vertical semiconductor patterns VS in the vertical direction, e.g., along a direction normal to a bottom of the first substrate 101.

A planarization insulating layer PL may cover an end of the cell stack structure CS and the second substrate 201. The planarization insulating layer PL may have a single layer or multilayer structure of at least one of, e.g., silicon oxide, silicon nitride, silicon oxynitride, and a porous insulator.

Figure 6:
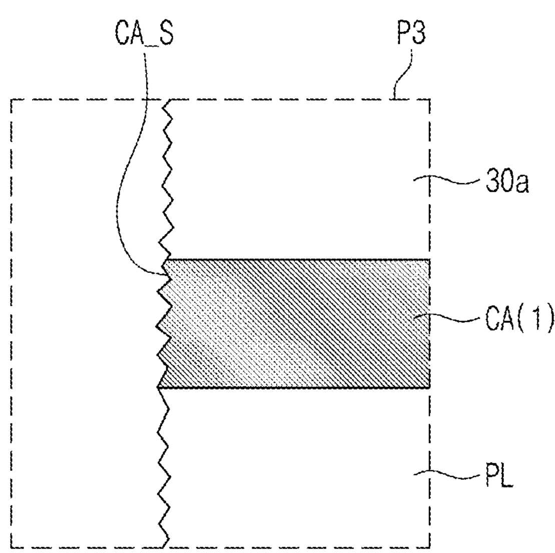
FIG. 6 is an enlarged view of portion ‘P3’ of FIG. 2.

A first cell alignment key CA(1) and first cell wires 16 may be disposed on the planarization insulating layer PL. The first cell alignment key CA(1) is disposed in the edge region ER. The first cell alignment key CA(1) may be disposed at an edge of the planarization insulating layer PL. In FIG. 6, a sidewall CA_S of the first cell alignment key CA(1) may be aligned with a sidewall of the planarization insulating layer PL. The first cell alignment key CA(1) does not overlap the first to third peripheral alignment keys PA(1), PA(2), and PA(3), e.g., in the vertical or horizontal directions. The first cell alignment key CA(1) does not overlap the cell stack structure CS, e.g., in the vertical or horizontal directions. The first cell alignment key CA(1) and the first cell wires 16 may have the same material and the same thickness as each other.

First to third cell contacts CC1, CC2, and CC3 may be disposed in the planarization insulating layer PL. The first cell contacts CC1 pass through the planarization insulating layer PL and the inter-electrode insulating layer 12 to connect ends of the electrode layers EL to some of the first cell wires 16. The second cell contact CC2 passes through the planarization insulating layer PL and the inter-electrode insulating layer 12 and connects an end of the first source pattern SC1 to other of the first cell wires 16.

The third cell contact CC3 passes through the planarization insulating layer PL, the second substrate 201, and the fourth peripheral insulating layer 20*d*, and connects other of the first cell wires 16 to some of the third peripheral wires 14*c*. A substrate insulating layer 22 may be interposed between the third cell contact CC3 and the second substrate 201. The substrate insulating layer 22 does not overlap the first to third peripheral alignment keys PA(1), PA(2), and PA(3), e.g., in the vertical or horizontal directions. The substrate insulating layer 22 may have a single layer or multilayer structure of at least one of, e.g., silicon oxide, silicon nitride, and silicon oxynitride.

The planarization insulating layer PL, the first cell alignment key CA(1), and the first cell wires 16 may be covered with a first cell insulating layer 30*a*. Bit line contact plugs BLPG may be disposed in the first cell insulating layer 30*a*. The bit line contact plugs BLPG may be in contact with bit line pads on the vertical semiconductor patterns VS, respectively.

Bit lines BL and second cell wires 26 may be disposed on the first cell insulating layer 30*a*. A second cell alignment key CA(2) (FIG. 1) may be disposed on the first cell insulating layer 30*a*. The second cell alignment key CA(2) is disposed in the edge region ER and does not overlap the first cell alignment key CA(1), e.g., in the vertical or horizontal directions. The second cell alignment key CA(2) may have the same material and the same thickness as those of the bit lines BL and the second cell wires 26. The second cell alignment key CA(2) does not overlap the first to third peripheral alignment keys PA(1) to PA(3) and the cell stack structure CS, e.g., in the vertical or horizontal directions. One side of the second cell alignment key CA(2) may be exposed without being covered with the second cell insulating layer 30*b*.

The first cell insulating layer 30*a*, the bit lines BL, the second cell wires 26, and the second cell alignment key CA(2) may be covered with the second cell insulating layer 30*b*. First cell vias 27 may be disposed in the second cell insulating layer 30*b*. A third cell alignment key CA(3) (FIG. 1) and conductive pads 28 may be disposed on the second cell insulating layer 30*b*. The third cell alignment key CA(3) is disposed in the edge region ER and does not overlap the first cell alignment key CA(1) and the second cell alignment key CA(2), e.g., in the vertical or horizontal directions. The third cell alignment key CA(3) does not overlap the first to third peripheral alignment keys PA(1), PA(2), and PA(3) and the cell stack structure CS, e.g., in the vertical or horizontal directions.

The second cell insulating layer 30*b* and the third cell alignment key CA(3) may be covered with a third cell insulating layer 30*c*. The third cell insulating layer 30*c* includes holes H1 exposing the conductive pads 28. One side of the third cell alignment key CA(3) may be exposed without being covered with the third cell insulating layer 30*c*.

The first to third cell insulating layers 30*a*, 30*b*, and 30*c* may have a single layer or multilayer structure of at least one of, e.g., silicon oxide, silicon nitride, silicon oxynitride, silicon carbonitride, and a porous insulator.

Each of the first to third peripheral alignment keys PA(1), PA(2), and PA(3) may have a first width W1 in the horizontal direction, e.g., in the X direction, as shown in FIG. 1. Each of the first to third cell alignment keys CA(1), CA(2), and CA(3) may have a second width W2 in the horizontal direction, e.g., in the X direction, as shown in FIG. 1. The second width W2 may be equal to or smaller than the first width W1.

Figure 4:
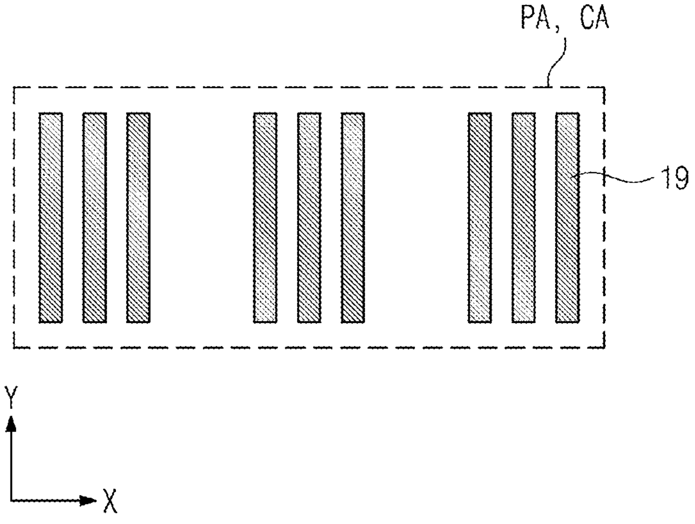
FIG. 4 is a plan view of a peripheral alignment key or cell alignment key according to embodiments.

FIG. 4 is a plan view of a peripheral alignment key or cell alignment key according to embodiments.

Referring to FIG. 4, the first to third peripheral alignment keys PA(1), PA(2), and PA(3) and the first to third cell alignment keys CA(1), CA(2), CA(3) may include a plurality of bar patterns 19. For example, each of the first to third peripheral alignment keys PA(1), PA(2), and PA(3) and the first to third cell alignment keys CA(1), CA(2), CA(3) may include a plurality of the bar patterns 19.

The bar patterns 19 may include a conductive material. The bar patterns 19 may be spaced apart from each other in the X direction, and may be elongated in the Y direction. Alternatively, the bar patterns 19 may be spaced apart from each other in the Y direction and elongated in the X direction.

Figure 5:
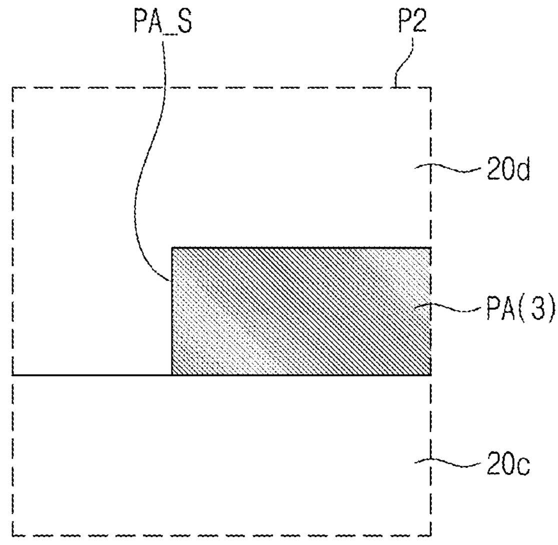
FIG. 5 is an enlarged view of portion ‘P2’ of FIG. 2.

FIG. 5 is an enlarged view of portion 'P2' of FIG. 2. FIG. 6 is an enlarged view of portion 'P3' of FIG. 2.

Referring to FIGS. 5 and 6, a surface roughness of sidewalls PA_S of the first to third peripheral alignment keys PA(1), PA(2), and PA(3) is smaller than a surface roughness of sidewalls CA_S of the first to third cell alignment keys CA(1), CA(2), CA(3).

As a size of a semiconductor device decreases, a space in which the first to third cell alignment keys CA(1), CA(2), and CA(3) are disposed, e.g., an area of the edge region ER, also decreases. As the semiconductor device become highly integrated and memory capacity increases, the number of alignment keys required also increases. However, in the semiconductor device according to embodiments, the first to third peripheral alignment keys PA(1), PA(2), and PA(3) may be disposed in the device region DR, and thus, a space (or area) in which the first to third peripheral alignment keys PA(1), PA(2), and PA(3) are disposed in the edge region ER may be sufficiently secured. As a result, a highly integrated and ultra-small semiconductor device may be provided.

For example, the semiconductor device 1000 may be a three-dimensional semiconductor memory device or a vertical NAND (VNAND). In another example, the semiconductor device 1000 may be a memory device, e.g., a dynamic random access memory (DRAM), a phase change random access memory (PRAM), a resistive random access memory (RRAM), or a static random access memory (SRAM). A plurality of memory cells may be disposed in the memory structure MS. The first to third peripheral alignment keys PA(1), PA(2), and PA(3) may overlap a plurality of memory cells, e.g., in the vertical direction.

For example, the semiconductor device 1000 may be a complementary metal oxide semiconductor (CMOS) image sensor (CIS). In this case, a pixel array region may be disposed instead of the memory structure MS. That is, the pixel array region may include a plurality of pixels, and the first to third peripheral alignment keys PA(1), PA(2), and PA(3) may overlap the plurality of pixels, e.g., in the vertical direction.

Although not shown, test patterns and overlay keys may be further provided on at least one of the first to fourth peripheral insulating layers 20*a*, 20*b*, 20*c*, and 20*d* and the first to third cell insulating layers 30*a*, 30*b*, and 30*c* in the edge region ER. Some of the test patterns and overlay keys may be disposed between the first to fourth peripheral insulating layers 20*a*, 20*b*, 20*c*, and 20*d* or on at least one of the first to fourth peripheral insulating layers 20*a*, 20*b*, 20*c*, and 20*d* in the device region DR.

Figure 7:
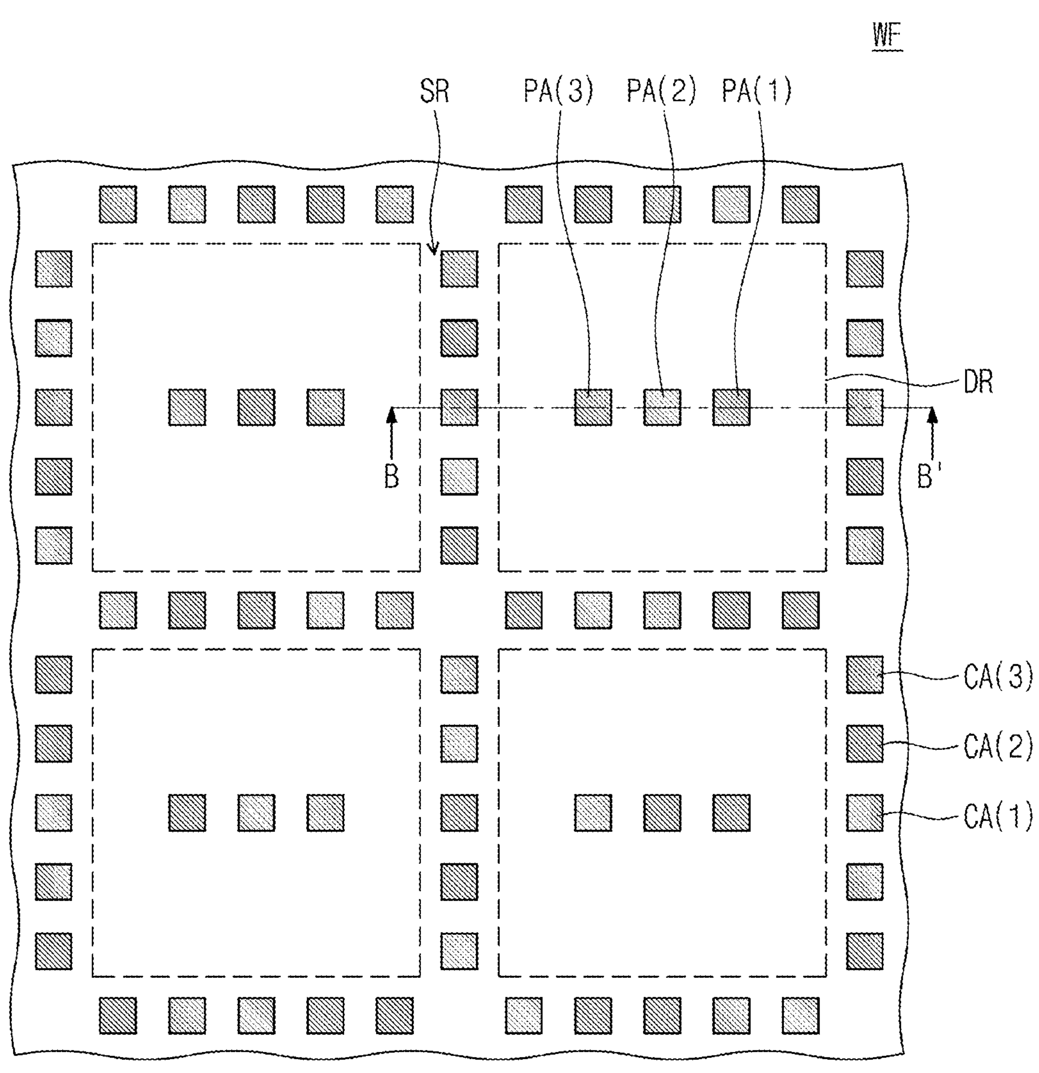
FIG. 7 is a top view of a portion of a wafer according to embodiments.

FIG. 7 is a top view of a portion of a wafer according to embodiments. FIGS. 8A to 8F are cross-sectional views illustrating a process of manufacturing the semiconductor device of FIG. 2. FIGS. 8A to 8F are cross-sectional views of FIG. 7 taken along line B-B'.

Figure 8A:
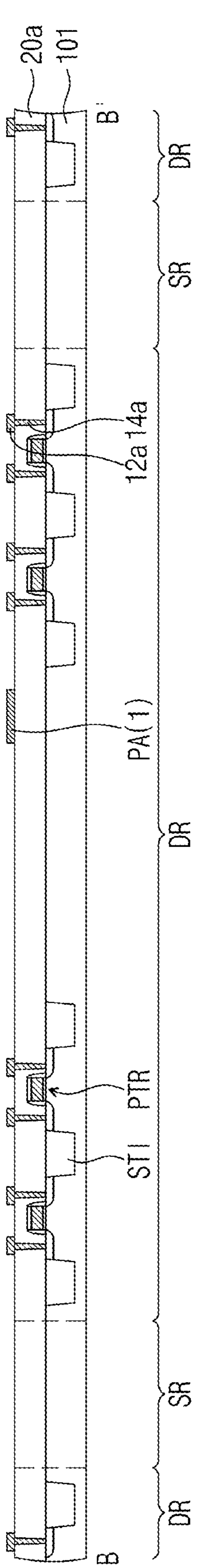
FIGS. 8A to 8F are cross-sectional views of stages in a process of manufacturing the semiconductor device of FIG. 2.

Referring to FIGS. 7 and 8A, a wafer WF may include device regions DR and a scribe lane region SR disposed therebetween. The wafer WF may include the first substrate 101. Active regions may be defined by forming the device isolation layers STI on the first substrate 101. The device isolation layers STI may be formed by a shallow trench isolation method. The first peripheral transistors PTR may be formed on the first substrate 101. The first peripheral insulating layer 20*a* covering the first peripheral transistors PTR may be formed on the first substrate 101. The first peripheral contacts 12*a* may be formed by etching the first peripheral insulating layer 20*a* to form contact holes and filling the contact holes with a conductive material. A conductive layer may be deposited on the first peripheral insulating layer 20*a* and then etched to form the first peripheral wires 14*a* and the first peripheral alignment key PA(1). The first peripheral wires 14*a* and the first peripheral alignment key PA(1) may be formed in the device region DR. The first peripheral transistors PTR may not be below the first peripheral alignment key PA(1), e.g., the first peripheral alignment key PA(1) may be horizontally spaced apart from the first peripheral transistors PTR so as not to overlap a top of the first peripheral transistors PTR.

Figure 8B:
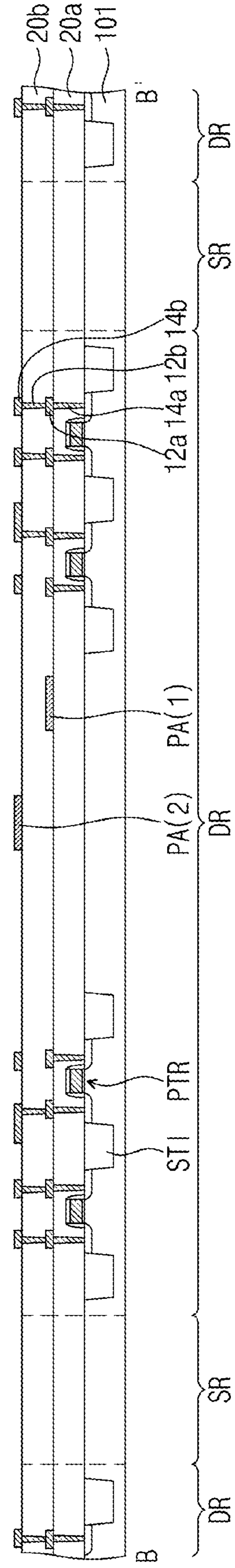

Referring to FIGS. 7 and 8B, the second peripheral insulating layer 20*b* may be formed on the first peripheral insulating layer 20*a*, the first peripheral alignment key PA(1), and the first peripheral wires 14*a*. The second peripheral insulating layer 20*b* may be etched to form via holes, and the first peripheral vias 12*b* may be formed using a conductive material. The first peripheral alignment key PA(1) may be used in an exposure process for forming a photoresist pattern to define a position and shape of the via holes. A conductive layer may be deposited on the second peripheral insulating layer 20*b* and then etched to form the second peripheral alignment key PA(2) and the second peripheral wires 14*b*. The second peripheral alignment key PA(2) and the second peripheral wires 14*b* may be formed in the device region DR. The second peripheral alignment key PA(2) does not overlap the first peripheral alignment key PA(1). In the exposure process for forming a photoresist pattern to define the position and shape of the second peripheral alignment key PA(2) and the second peripheral wires 14*b*, the first peripheral alignment key PA(1) may be used.

Figure 8C:
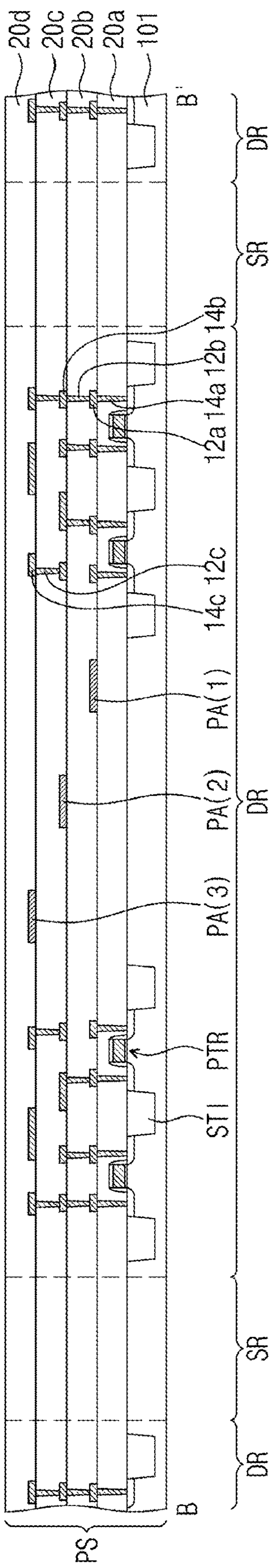

Referring to FIGS. 7 and 8C, the third peripheral insulating layer 20*c* may be formed on the second peripheral insulating layer 20*b*, the second peripheral alignment key PA(2), and the second peripheral wires 14*b*. The third peripheral insulating layer 20*c* may be etched to form via holes, and the second peripheral vias 12c may be formed using a conductive material. The second peripheral alignment key PA(2) may be used in an exposure process for forming a photoresist pattern to define a position and shape of the via holes. A conductive layer is deposited on the third peripheral insulating layer 20c and etched to form the third peripheral alignment key PA(3) and the third peripheral wires 14c. The third peripheral alignment key PA(3) and the third peripheral wires 14c may be formed in the device region DR. The third peripheral alignment key PA(3) does not overlap the second peripheral alignment key PA(2) and the first peripheral alignment key PA(1). In the exposure process for forming the photoresist pattern for defining the position and shape of the third peripheral alignment key PA(3) and the third peripheral wires 14c the second peripheral alignment key PA(2) may be used. The fourth peripheral insulating layer 20d may be formed on the third peripheral insulating layer 20c, the third peripheral alignment key PA(3), and the third peripheral wires 14c. As a result, a peripheral circuit structure PS may be formed.

Figure 8D:
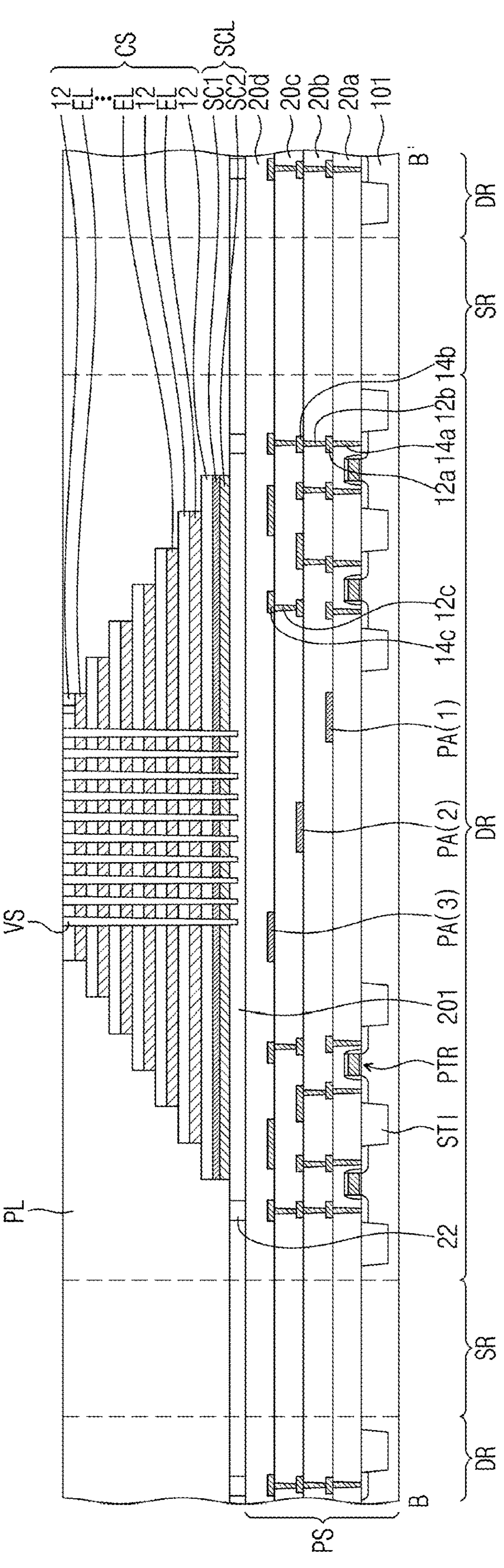

Referring to FIGS. 7 and 8D, the second substrate 201 may be formed on the fourth peripheral insulating layer 20d. The substrate insulating layer 22 may be formed by etching the second substrate 201 to form a trench exposing the fourth peripheral insulating layer 20d and filling the trench with an insulating material. In the exposure process for forming a photoresist pattern for defining a position and shape of the trench, the third peripheral alignment key PA(3) may be used. The source structure SCL, the cell stack structure CS, the vertical semiconductor patterns VS, the gate insulating layer GO (in FIG. 3), and the like may be formed on the second substrate 201 through a conventional process. The planarization insulating layer PL may be formed on the second substrate 201 and a polishing process may be performed to expose an upper surface of the cell stack structure CS.

Figure 8E:
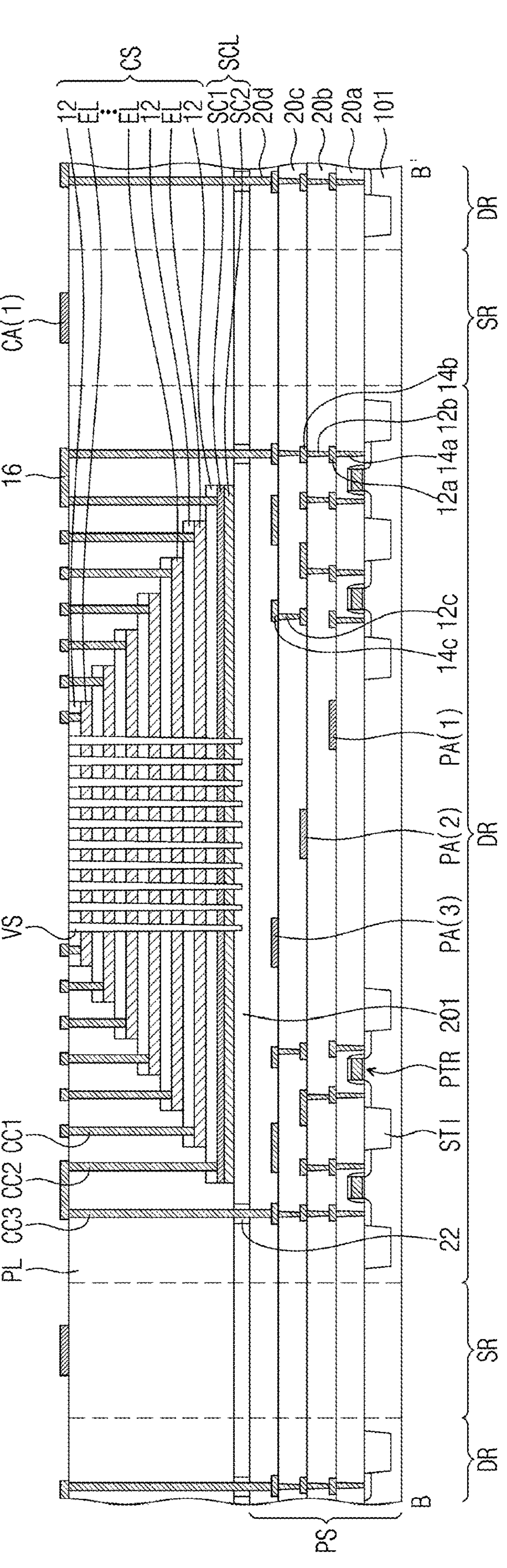

Referring to FIGS. 7 and 8E, first and second cell contact holes are formed by etching the planarization insulating layer PL and the inter-electrode insulating layers 12, and are filled with a conductive material to form the first and second cell contacts CC1 and CC2. Then, the planarization insulating layer PL, the substrate insulating layer 22, and the fourth peripheral insulating layer 20d are etched to form a third cell contact hole and fill the third cell contact hole with a conductive material to form the third cell contact CC3. A conductive layer is formed on the planarization insulating layer PL and the cell stack structure CS and then etched to form the first cell wires 16 and the first cell alignment key CA(1). The first cell alignment key CA(1) may be formed in the scribe lane region SR.

Figure 8F:
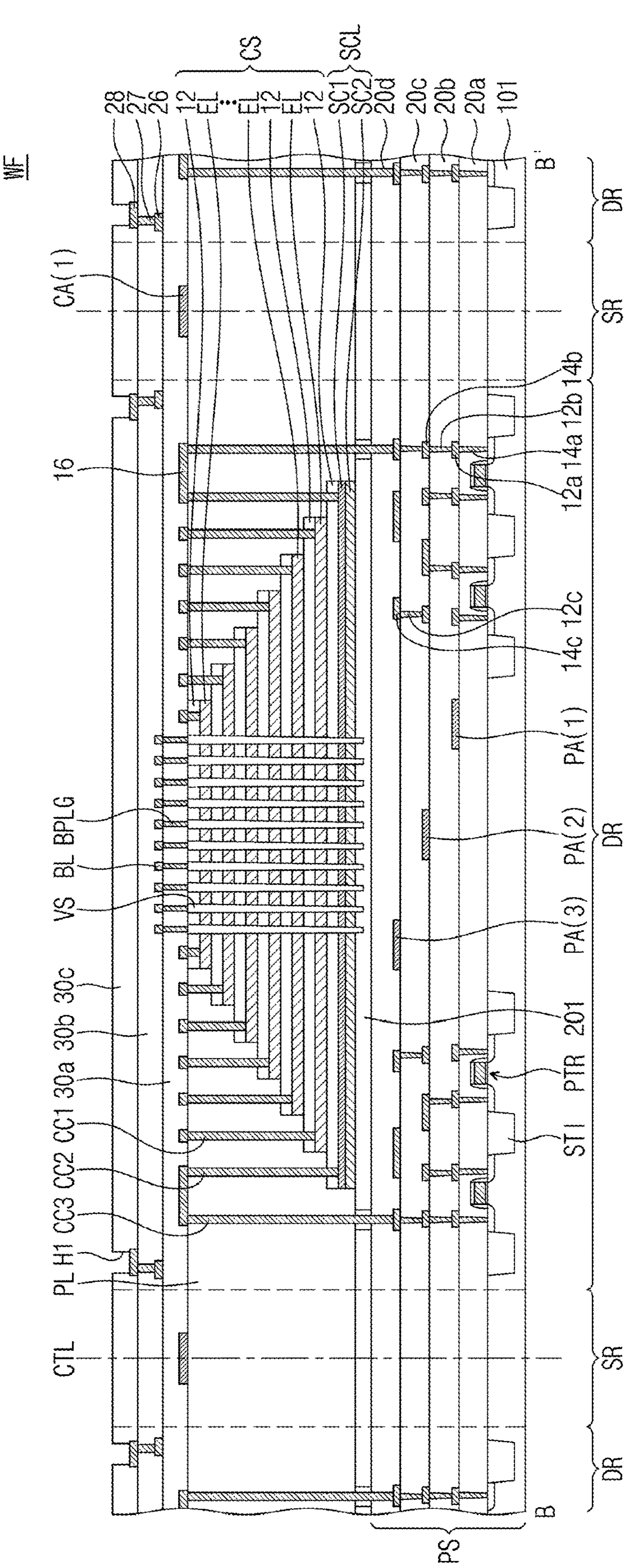

Referring to FIGS. 7 and 8F, the first cell insulating layer 30a is formed on the planarization insulating layer PL, the first cell wires 16, and the first cell alignment key CA(1). Bit line contact holes are formed by etching the first cell insulating layer 30a and filled with a conductive material to form bit line contact plugs BPLG. The first cell alignment key CA(1) may be used in an exposure process for forming a photoresist pattern to define a position and shape of the bit line contact holes. A conductive layer is deposited on the first cell insulating layer 30a and then etched to form the bit lines BL, the second cell wires 26 and the second cell alignment key CA(2) of FIG. 1. In an exposure process for forming a photoresist pattern to define a position and shape of the bit lines BL, the second cell wires 26, and the second cell alignment key CA(2) of FIG. 1, the first cell alignment key CA(1) may be used. The second cell alignment key CA(2) does not overlap the first cell alignment key CA(1).

Referring to FIGS. 7 and 8F, the second cell insulating layer 30b is formed on the first cell insulating layer 30a, the bit lines BL, the second cell wires 26, and the second cell alignment key CA(2). Cell via holes are formed by etching the second cell insulating layer 30b, and the first cell vias 27 are formed by filling the cell via holes with a conductive material. In an exposure process for forming a photoresist pattern to define a position and shape of the cell via holes, the second cell alignment key CA(2) may be used. A conductive layer is deposited on the second cell insulating layer 30b and then etched to form the conductive pads 28 and the third cell alignment key CA(3) of FIG. 1. In an exposure process for forming a photoresist pattern for defining a position and shape of the conductive pads 28 and the third cell alignment key CA(3) of FIG. 1, the second cell alignment key CA(2) may be used. The third cell alignment key CA(3) does not overlap the second cell alignment key CA(2) and the first cell alignment key CA(1).

The third cell insulating layer 30c may be formed on the second cell insulating layer 30b and then etched to form holes H1 exposing the conductive pads 28. A sawing process of cutting the wafer WF along a cutting line CTL in the scribe lane region SR is performed. As a result, the semiconductor device 1000 of FIGS. 1 and 2 may be manufactured. A portion of the scribe lane region SR may become the edge region ER of the semiconductor device 1000. The sawing process may be performed using a laser beam or blade. In the sawing process, some of the first to third cell alignment keys CA(1), CA(2), and CA(3) are also cut. As a result, the side surfaces of the first to third cell alignment keys CA(1), CA(2), and CA(3) have large surface roughness, as shown in FIG. 6.

In a method of manufacturing a semiconductor device according to embodiments, the first to third peripheral alignment keys PA(1), PA(2), and PA(3) may be formed in the device region DR, and thus, the space (or area) in which the first to third cell alignment keys CA(1), CA(2), and CA(3) are arranged may be sufficiently secured. Accordingly, the semiconductor device may be manufactured without defects, thereby improving a yield thereof.

FIG. 9 is a cross-sectional view of a semiconductor device according to embodiments.

Referring to FIG. 9, a semiconductor device 1001 according to the present example may include a first peripheral circuit structure PS1, a memory structure MS, and a second peripheral circuit structure PS2 sequentially stacked.

The first peripheral circuit structure PS1 may include the first substrate 101. First device isolation layers STI1 may be disposed on the first substrate 101 to define active regions. First peripheral transistors PTR1 may be disposed on the first substrate 101. The first peripheral transistors PTR1 may be covered with the first peripheral insulating layer 20a. The first peripheral contacts 12a may be disposed in the first peripheral insulating layer 20a. The first peripheral wires 14a and the first peripheral alignment key PA(1) may be disposed on the first peripheral insulating layer 20a. The second peripheral insulating layer 20b may be disposed on the first peripheral insulating layer 20a, the first peripheral alignment key PA(1), and the first peripheral wires 14a. The first peripheral vias 12b may be disposed in the second peripheral insulating layer 20b and may be in contact with some of the first peripheral wires 14a. The second peripheral alignment key PA(2) and the second peripheral wires 14b may be disposed on the second peripheral insulating layer 20b. The third peripheral insulating layer 20c may be disposed on the second peripheral insulating layer 20b, the second peripheral alignment key PA(2), and the second peripheral wires 14*b*. The second peripheral vias 12*c* may be disposed in the third peripheral insulating layer 20*c* and may be in contact with some of the second peripheral wires 14*b*. The third peripheral alignment key PA(3) and the third peripheral wires 14*c* may be disposed on the third peripheral insulating layer 20*c*. The fourth peripheral insulating layer 20*d* may be disposed on the third peripheral insulating layer 20*c*, the third peripheral alignment key PA(3), and the third peripheral wires 14*c*.

The memory structure MS may be the same as/similar to that described with reference to FIG. 2. The memory structure MS may include the second substrate 201, the source structure SCL, and the cell stack structure CS, which are sequentially stacked. The vertical semiconductor patterns VS may pass through the cell stack structure CS and the source structure SCL and may be adjacent to the second substrate 201. The gate insulating layer GO may be interposed between the vertical semiconductor patterns VS and the cell stack structure CS.

The planarization insulating layer PL may cover an end of the cell stack structure CS and the second substrate 201. The first cell alignment key CA(1) and the first cell wires 16 may be disposed on the planarization insulating layer PL. The first to third cell contacts CC1, CC2, and CC3 may be disposed in the planarization insulating layer PL. The planarization insulating layer PL, the first cell alignment key CA(1), and the first cell wires 16 may be covered with the first cell insulating layer 30*a*. The bit line contact plugs BLPG may be disposed in the first cell insulating layer 30*a*. The bit lines BL and the second cell alignment key CA(2) of FIG. 1 may be disposed on the first cell insulating layer 30*a*. The first cell insulating layer 30*a*, the bit lines BL, and the second cell alignment key CA(2) may be covered with a second cell insulating layer 30*b*. First metal pads CP1 may be disposed on top of the second cell insulating layer 30*b*. First cell vias 17*a* are disposed in the second cell insulating layer 30*b*, and one of the bit lines BL may be connected to one of the first metal pads CP1. The second cell vias 17*b* may pass through the second cell insulating layer 30*b* and the first cell insulating layer 30*a* to connect one of the first cell wires 16 to another one of the first metal pads CP1.

The second peripheral circuit structure PS2 may include a third substrate 301. Second device isolation layers STE may be disposed on the third substrate 301 to define active regions. Second peripheral transistors PTR2 are disposed on the third substrate 301. A lower surface of the third substrate 301 and the second peripheral transistors PTR2 may be covered with a fifth peripheral insulating layer 40*a*. Second peripheral contacts 32*a* are disposed in the fifth peripheral insulating layer 40*a*. Fourth peripheral wires 34*a* and a fourth peripheral alignment key PA(4) may be disposed under the fifth peripheral insulating layer 40*a*. A sixth peripheral insulating layer 40*b* may be disposed under the fifth peripheral insulating layer 40*a*, the fourth peripheral wires 34*a*, and the fourth peripheral alignment key PA(4). Third peripheral vias 32*b* may be disposed in the sixth peripheral insulating layer 40*b* and may be in contact with some of the fourth peripheral wires 34*a*. A fifth peripheral alignment key PA(5) and fifth peripheral wires 34*b* may be disposed under the sixth peripheral insulating layer 40*b*. A seventh peripheral insulating layer 40*c* may be disposed under the sixth peripheral insulating layer 40*b*, the fifth peripheral alignment key PA(5), and the fifth peripheral wires 34*b*. Fourth peripheral vias 32*c* may be disposed in the seventh peripheral insulating layer 40*c* and may be in contact with some of the fifth peripheral wires 34*b*. A sixth peripheral alignment key PA(6) and sixth peripheral wires 34*c* may be disposed below the seventh peripheral insulating layer 40*c*. An eighth peripheral insulating layer 40*d* is disposed under the seventh peripheral insulating layer 40*c*, the sixth peripheral alignment key PA(6), and the sixth peripheral wires 34*c*. Second metal pads CP2 may be disposed under the eighth peripheral insulating layer 40*d*. Fifth peripheral vias 32*d* are disposed in the eighth peripheral insulating layer 40*d* to connect one of the sixth peripheral wires 34*c* to one of the second metal pads CP2.

The fourth to sixth peripheral alignment keys PA(4), PA(5), and PA(6) are disposed in the device region DR. The fourth to sixth peripheral alignment keys PA(4), PA(5), and PA(6) may overlap the cell stack structure CS. At least one of the fourth to sixth peripheral alignment keys PA(4), PA(5), and PA(6) may overlap at least one of the vertical semiconductor patterns VS.

The second metal pads CP2 may be in direct contact with the first metal pads CP1. There may be no interface between the second metal pad CP2 and the first metal pad CP1 in contact with the second metal pad CP2. A lower surface of the eighth peripheral insulating layer 40*d* may be in contact with an upper surface of the second cell insulating layer 30*b*.

A rear insulating layer 41 may be disposed on the upper surface of the third substrate 301. A conductive pad 28 may be disposed on the rear insulating layer 41. A through-via 29 passes through the rear insulating layer 41, the third substrate 301, the second device isolation layer STI2, and the fifth peripheral insulating layer 40*a*, and connects one of the fourth peripheral wires 34*a* to the conductive pad 28. A side surface of the through-via 29 may be covered with a via insulating layer 31. Other structures may be the same/similar to those described with reference to FIGS. 1 to 6.

In the semiconductor device 1001 of FIG. 9, the first peripheral circuit structure PS1 and the memory structure MS are manufactured in the same/similar manner as those of FIGS. 8A to 8F. Also, separately, the second peripheral circuit structure PS2 is manufactured in the same/similar manner as in FIGS. 8A to 8C. The second peripheral circuit structure PS2 is turned over and placed on the memory structure MS, and a thermal compression process may be performed to bond the second peripheral circuit structure PS2 onto the memory structure MS. In this case, the first and second metal pads CP1 and CP2 may be coupled to each other.

Figure 10:
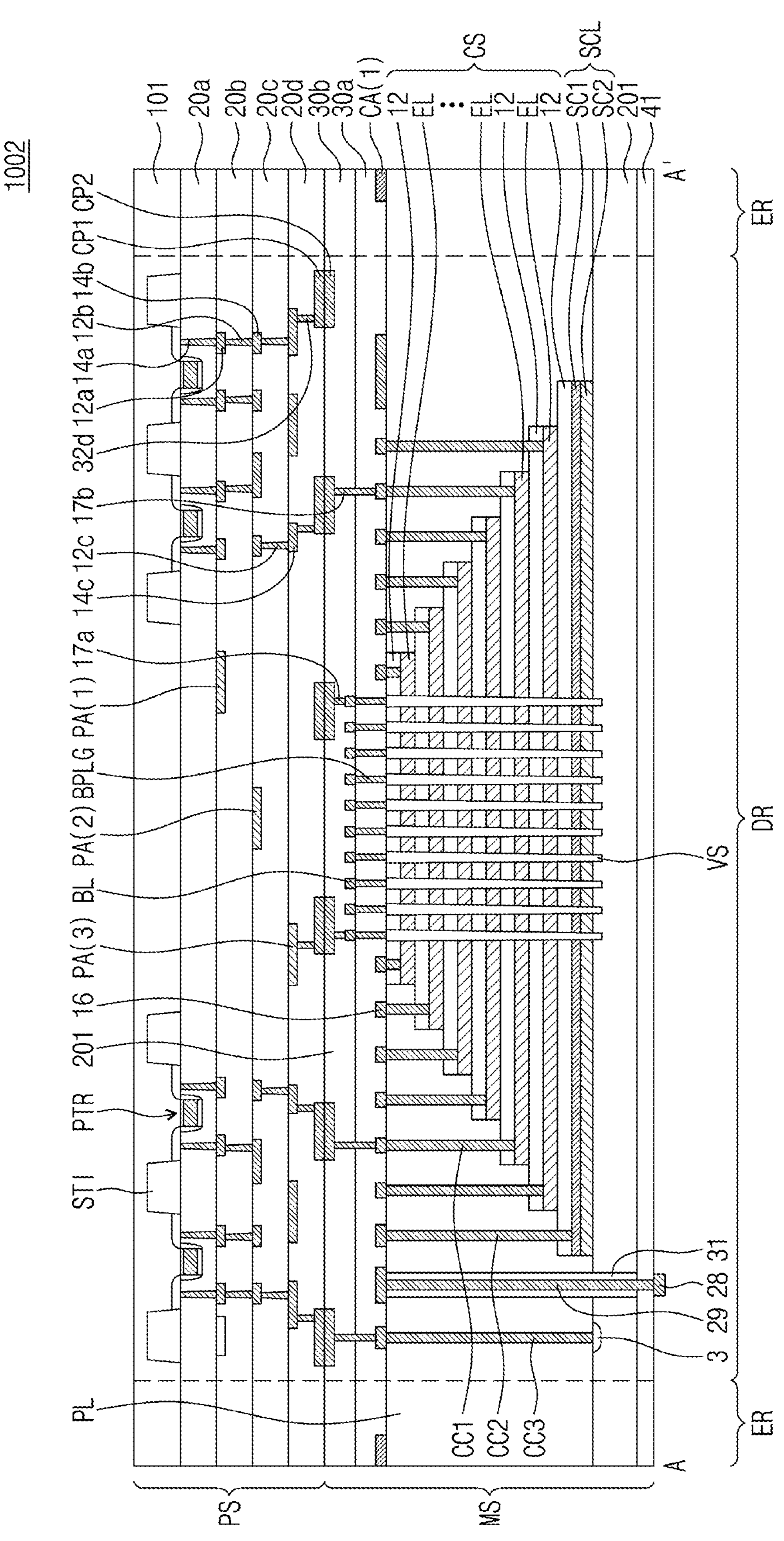
FIG. 10 is a cross-sectional view of a semiconductor device according to embodiments.

FIG. 10 is a cross-sectional view of a semiconductor device according to embodiments.

Referring to FIG. 10, a semiconductor device 1002 according to the present example may include a memory structure MS and a peripheral circuit structure PS disposed thereon.

In the memory structure MS, a third cell contact CC3 is in contact with an impurity region 3 formed on the second substrate 201. The impurity region 3 may be doped with impurities of the same conductivity type as impurities doped in the second substrate 201 but may have a higher concentration than a concentration of the impurities doped in the second substrate 201. A lower surface of the second substrate 201 may be covered with the rear insulating layer 41. The conductive pad 28 may be disposed under the rear insulating layer 41. The through-via 29 passes through the rear insulating layer 41, the second substrate 201, and the planarization insulating layer PL to connect one of the first cell wires 16 to the conductive pad 28. A side surface of the through-via 29 may be covered with a via insulating layer 31. Other structures may be the same/similar to those described with reference to FIG. 9.

The peripheral circuit structure PS1 has a structure in which the peripheral circuit structure PS1 described with reference to FIG. 2 is inverted. Second metal pads CP2 are disposed below a fourth peripheral insulating layer 20*d*. Fifth peripheral vias 32*d* are disposed in the fourth peripheral insulating layer 20*d* to connect one of the third peripheral wires 14*c* to one of the second metal pads CP2. A lower surface of the fourth peripheral insulating layer 20*d* may be in contact with an upper surface of the second cell insulating layer 30*b*. Other structures may be the same/similar to those described with reference to FIGS. 1 to 6.

In the semiconductor device 1002 of FIG. 10, the peripheral circuit structure PS is manufactured as described with reference to FIGS. 8A to 8C. The memory structure MS is separately manufactured. The peripheral circuit structure PS is turned over and placed on the memory structure MS, and a thermal compression process is performed to bond the peripheral circuit structure PS onto the memory structure MS. In this case, the first and second metal pads CP1 and CP2 may be coupled to each other.

By way of summation and review, embodiments provide a highly integrated and ultra-small semiconductor device. That is, in the semiconductor device according to embodiments, the peripheral alignment keys may be disposed in the device region (e.g., rather than in the edge region), and thus, sufficient space for the cell alignment keys may be secured in the edge region or the scribe lane region. As a result, a highly integrated and ultra-small semiconductor device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first peripheral circuit structure; and a cell stack structure on the first peripheral circuit structure, the cell stack structure including electrode layers and inter-electrode insulating layers that are alternately and repeatedly stacked, wherein the first peripheral circuit structure includes:

a first substrate;

first peripheral transistors on the first substrate;

a first peripheral insulating layer covering the first substrate and the first peripheral transistors; and a first peripheral alignment key on the first peripheral insulating layer, the first peripheral alignment key overlapping the cell stack structure and being electrically isolated from the first peripheral transistors.

2. The semiconductor device as claimed in claim 1, wherein the first peripheral circuit structure further includes:

a second peripheral insulating layer covering the first peripheral alignment key and the first peripheral insulating layer; and a second peripheral alignment key on the second peripheral insulating layer, the second peripheral alignment key overlapping the cell stack structure and being electrically isolated from the first peripheral transistors.

3. The semiconductor device as claimed in claim 2, wherein the second peripheral alignment key does not overlap the first peripheral alignment key.

4. The semiconductor device as claimed in claim 1, further comprising vertical semiconductor patterns passing through the cell stack structure, the first peripheral alignment key overlapping at least one of the vertical semiconductor patterns.

5. The semiconductor device as claimed in claim 1, wherein the first peripheral alignment key includes a plurality of parallel bar patterns arranged side by side with each other in a first direction, the plurality of parallel bar patterns having equal extension length in a second direction intersecting the first direction.

6. The semiconductor device as claimed in claim 1, further comprising:

a planarization insulating layer covering an end of the cell stack structure and the first peripheral circuit structure; and a cell alignment key on the planarization insulating layer, the cell alignment key having a non-overlapping relationship with the first peripheral alignment key.

7. The semiconductor device as claimed in claim 6, wherein the cell alignment key has a non-overlapping relationship with the cell stack structure.

8. The semiconductor device as claimed in claim 6, wherein the cell alignment key is at an edge of the planarization insulating layer.

9. The semiconductor device as claimed in claim 6, wherein the first peripheral alignment key has a first width, and the cell alignment key has a second width smaller than the first width.

10. The semiconductor device as claimed in claim 6, wherein a side surface of the first peripheral alignment key has a first surface roughness, and a side surface of the cell alignment key has a second surface roughness greater than the first surface roughness.

11. The semiconductor device as claimed in claim 1, further comprising a second peripheral circuit structure on the cell stack structure, the second peripheral circuit structure including:

a second substrate;

second peripheral transistors on the second substrate;

a second peripheral insulating layer covering the second substrate and the second peripheral transistors; and a second peripheral alignment key on the second peripheral insulating layer, the second peripheral alignment key overlapping the cell stack structure.

12. A semiconductor device, comprising:

a first peripheral circuit structure;

a cell stack structure on the first peripheral circuit structure, the cell stack structure including electrode layers and inter-electrode insulating layers that are alternately and repeatedly stacked;

a planarization insulating layer covering an end of the cell stack structure and the first peripheral circuit structure; and a cell alignment key on an edge of the planarization insulating layer, wherein the first peripheral circuit structure includes:

a first substrate;

first peripheral transistors on the first substrate;

a first peripheral insulating layer covering the first substrate and the first peripheral transistors; and a first peripheral alignment key on the first peripheral insulating layer, a side surface of the first peripheral alignment key having a first surface roughness, and a side surface of the cell alignment key having a second surface roughness greater than the first surface roughness.

13. The semiconductor device as claimed in claim 12, wherein the first peripheral alignment key overlaps the cell stack structure.

14. The semiconductor device as claimed in claim 12, wherein the first peripheral circuit structure further includes: a second peripheral insulating layer covering the first peripheral alignment key and the first peripheral insulating layer; and a second peripheral alignment key on the second peripheral insulating layer and having a non-overlapping relationship with the first peripheral alignment key, the second peripheral alignment key overlapping the cell stack structure.

15. The semiconductor device as claimed in claim 12, further comprising vertical semiconductor patterns passing through the cell stack structure, the first peripheral alignment key overlapping at least one of the vertical semiconductor patterns.

16. The semiconductor device as claimed in claim 12, wherein the first peripheral alignment key has a first width, and the cell alignment key has a second width smaller than the first width.

17. A semiconductor device, comprising:

a first peripheral circuit structure;

a cell stack structure on the first peripheral circuit structure, the cell stack structure including electrode layers and inter-electrode insulating layers that are alternately and repeatedly stacked;

vertical semiconductor patterns passing through the cell stack structure;

a gate insulating layer between the vertical semiconductor patterns and the cell stack structure;

a planarization insulating layer covering an end of the cell stack structure and the first peripheral circuit structure; and a cell alignment key on an edge of the planarization insulating layer, the first peripheral circuit structure including:

a first substrate; first peripheral transistors on the first substrate;

a first peripheral insulating layer covering the first substrate and the first peripheral transistors; and a first peripheral alignment key on the first peripheral insulating layer, the first peripheral alignment key having a first width and overlapping at least one of the vertical semiconductor patterns and being electrically isolated from the first peripheral transistors, and the cell alignment key having a second width smaller than the first width.

18. The semiconductor device as claimed in claim 17, wherein a side surface of the first peripheral alignment key has a first surface roughness, and a side surface of the cell alignment key has a second surface roughness greater than the first surface roughness.

19. The semiconductor device as claimed in claim 17, wherein the first peripheral circuit structure further includes:

a second peripheral insulating layer covering the first peripheral alignment key and the first peripheral insulating layer; and a second peripheral alignment key on the second peripheral insulating layer and having a non-overlapping relationship with the first peripheral alignment key, the second peripheral alignment key overlapping the cell stack structure and being electrically isolated from the first peripheral transistors.

20. The semiconductor device as claimed in claim 17, further comprising a second peripheral circuit structure on the cell stack structure, the second peripheral circuit structure including:

a second substrate;

second peripheral transistors on the second substrate;

a second peripheral insulating layer covering the second substrate and the second peripheral transistors; and a second peripheral alignment key on the second peripheral insulating layer, the second peripheral alignment key overlapping the cell stack structure.

* * * * *